(12) United States Patent
Chiang et al.

(10) Patent No.: US 6,658,068 B1
(45) Date of Patent: Dec. 2, 2003

(54) DETECTION OF EFM STREAM COMPONENT WIDTHS

(75) Inventors: Kevin Chiang, Fremont, CA (US); Shengquan Wu, Sunnyvale, CA (US); Jhy-ping Shaw, San Jose, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/418,897

(22) Filed: Oct. 15, 1999

(51) Int. Cl.⁷ .............................. H04L 27/06; H03K 7/08
(52) U.S. Cl. ...................... 375/342; 375/340; 375/341; 375/238; 375/239
(58) Field of Search .................... 375/342, 237, 375/238, 239, 316, 340, 341

(56) References Cited

U.S. PATENT DOCUMENTS

| | | | | |
|---|---|---|---|---|
| 3,562,494 A | * | 2/1971 | Schmidt | 235/61.11 |
| 4,287,596 A | * | 9/1981 | Chari | 375/49 |
| 4,687,321 A | * | 8/1987 | Itoh | 355/41 |
| 5,933,458 A | * | 8/1999 | Leurent et al. | 375/317 |

* cited by examiner

Primary Examiner—Stephen Chin
Assistant Examiner—Sam K Ahn
(74) Attorney, Agent, or Firm—John F. Schipper

(57) ABSTRACT

Method and system for determining varying widths of each of a sequence of signal components (marks and spaces) in an incoming digital signal stream and for indicating which mark widths and which space widths fall outside acceptable ranges. A pre-mark and pre-space are added to the front end of the recieved stream for alignment purposes. The width of each signal component (mark or space) is determined and compared with an acceptable range of mark widths or space widths. Each mark or space that lies outside an acceptable range has an indicium associated with this mark or space, indicating this non-compliance. The modified digital signal stream, including the indicia, is re-issued after a selected time delay for subsequent signal processing. A method for measurement or estimation of mark width and space width is presented.

38 Claims, 3 Drawing Sheets

DETECTION OF EFM STREAM COMPONENT WIDTHS

FIELD OF THE INVENTION

This invention relates to detection of "mark" and "space" widths in an incoming digital signal stream.

BACKGROUND OF THE INVENTION

When a digital signal stream is being received, the temporal width of each mark values (high states or "1") and the temporal width of each space value (low state or "0") can vary within an acceptable range, or may sometimes have a width outside the acceptable range, such as $w1 \leq w \leq w2$. Where a mark width or a space width lies within the corresponding acceptable range, a digital signal processing device can recognize and properly process that mark or space. However, a mark width (or space width) that is too large or too small, and thus lies outside an acceptable range, must be promptly detected.

What is needed is a system and method for examining a stream of digital signal marks and spaces sequentially and for quickly recognizing a mark or a space (referred to as a digital signal stream "component") that has a width w that is smaller than a first value w1, or that is greater than a second value w2, and for promptly associating an indicium with this component that indicates that the width of this component lies outside the corresponding acceptable range.

SUMMARY OF THE INVENTION

These needs are met by the invention, which provides a system and method for off-line examination of mark widths and space widths and for association of a selected indicium with every stream component having a width w that lies outside a permissible range, such as $w1 \leq w \leq w2$. This examination process requires only a small, constant time delay, related to the relative sizes of the width values w1 and w2, so that processing of the resulting (compensated) digital signal occurs uninterrupted, apart from this small, constant time delay. The digital signal stream is divided into groups of consecutive marks and consecutive spaces, and each group of consecutive marks or consecutive spaces is examined in turn. This allows the width examination process within each group to proceed without requiring separate and time-consuming identification of each incoming signal component as a mark or a space.

DESCRIPTION OF THE INVENTION

Figure 1:
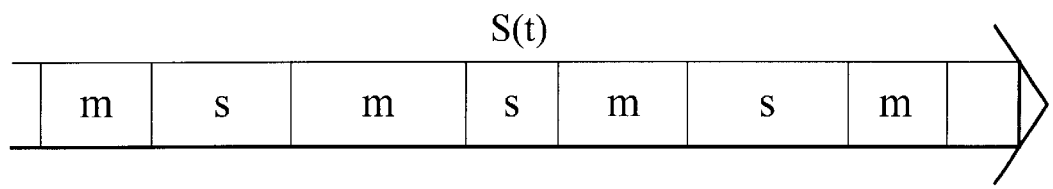
FIG. 1 illustrates a portion of a representative digital signal stream s(t), defined by a sequence of marks and spaces, versus time.

FIG. 1 illustrates graphically a portion of a representative sequence or stream of marks (each a consecutive group of one or more symbols having a first value, such as "1") and spaces (each a consecutive group of one or more symbols having a second, distinct value, such as "0") for an incoming digital signal s(t). The temporal width w of each separate mark and of each separate space will normally lie in a range $w_{1,x} \leq w \leq w_{2,x}$, where $w_{1,x}$ and $w_{2,x}$ are selected minimum and maximum widths, respectively (x=m for mark; x=s for space). In one format, $w_{1,x}$ and $w_{2,x}$ are optionally chosen to be 3T and 11T, respectively, for both the mark and the space, where T is a selected clock interval length in the range of 1–1000 nanoseconds (nsec). T is fixed for a given process but may be adjusted from one process to another. However, any two reasonable positive values $w_{1,x}$ and $w_{2,x}$ satisfying $w_{1,x} < w_{2,x}$ may be used here. The values $w_{1,m}$ and $w_{1,s}$, and also the values $w_{2,m}$ and $w_{2,s}$, need not be the same, but the analysis is more convenient if these pairs of range values are identical. Interest centers on which mark widths $w_m$ and which space widths ws do not satisfy the relations $$w_{1,x} \leq w_x \leq w_{2,x} \quad (x=m,s). \tag{1}$$

Figure 2:
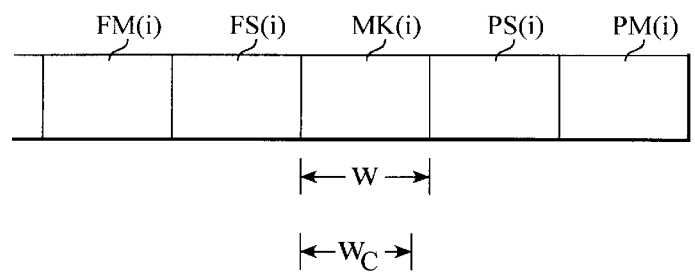
FIG. 2 illustrates a sequence of five component aggregations (FM, FS, MK, PS, PM) that are used in practicing the invention.

The widths of five consecutive groups of components (individual marks and spaces) of the digital signal sequence s(t), referred to as FM (pre-mark), FS (pre-space), MK (current mark), PS (post-space) and PM (post-mark), as illustrated in FIG. 2, are examined here. The first real signal component in the actual digital signal stream is assumed to be a mark. The first mark in the initial sequence is a fictitious initial pre-mark FM(0), having a mark width, w(FM;0), that lies within the accepted range of mark widths. The first space in this initial sequence is a fictitious initial pre-space FS(0), having a width, w(FS;0), that lies in the accepted range of space widths. The second mark in this initial sequence (the first mark in the real digital signal stream) is an initial current mark MK(0), which may have a varying mark width w(MK;0). The second space in this initial sequence (the first space in the real digital signal stream) is an initial post-space PS(0), which may have a varying space width w(PS;0). The third mark in this initial sequence (the second mark in the real digital signal stream) is an initial post-mark PM(0), which may have a varying mark width w(PM;0). The last signal component in the actual digital signal stream can be a mark or a space.

Figure 3:
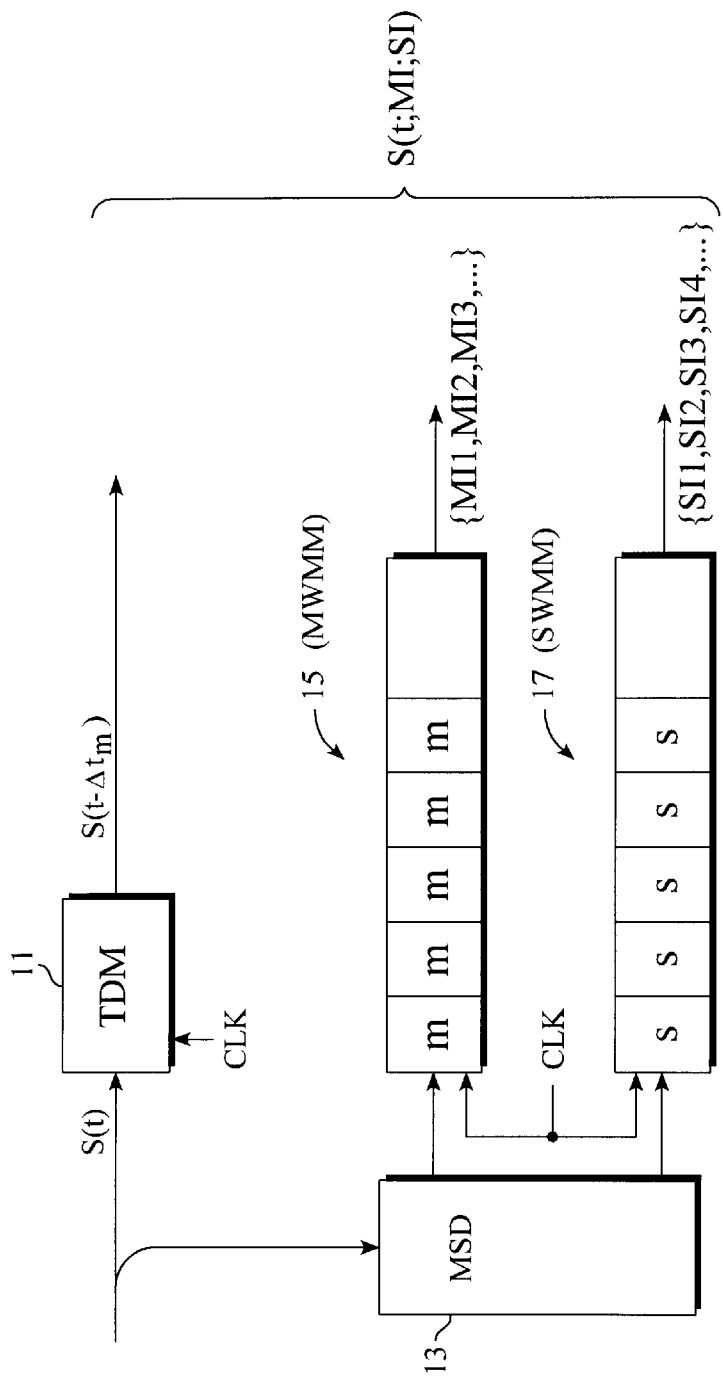
FIG. 3 is a schematic view of apparatus suitable for practicing the invention.

This initial sequence FM/FS/MK/PS/PM is received by a time delay module TDM 11, by a mark/space discriminator (MSD) module 13, shown in FIG. 3. The TDM 11 receives an incoming digital signal s(t) and reproduces this signal with a selected time delay $\Delta t_d$, issuing a time delayed signal $s(t-\Delta t_d)$ as shown. The MSD 13 receives the signal s(t), aligns the components, reproduces each mark component, sends each mark component to a mark width measuring module MWMM 15, reproduces each space component, and sends each space component to a space width measuring module SWMM 17, as shown.

The mark width measuring module MWMM 15 receives the sequence of mark components from the incoming signal s(t), sequentially measures or estimates the width of each mark component in the signal s(t), and issues a sequence of mark width indicia MWI={MI1, MI2, MI3, . . . }, representing the ordered sequence of mark widths. In a first version, the mark width indicia distinguish between mark components whose widths are too small ($w<w_{1,m}$), mark components whose widths are too large ($w>w_{2,m}$) and mark components whose widths are in an acceptable range ($w_{1,m} \leq w \leq W_{2,m}$). In another version, the mark width indicia distinguish between mark components that are outside an acceptable range ($w<w_{1,m}$ or $w>w_{2,m}$) and mark widths that are within an acceptable range $w_{1,m} \leq w \leq w_{2,m}$). In another version, the mark width indicia represent the measured or estimated mark widths themselves.

The space width measuring module SWMM 17 receives the sequence of space components from the incoming signal s(t), sequentially measures or estimates the width of each space component in the signal s(t), and issues a sequence of space width indicia SWI={SI1, SI2, SI3, . . . .}, representing the ordered sequence of space widths. In a first version, the space width indicia distinguish between space components whose widths are too small (w<$w_{1,s}$), space components whose widths are too large (w>$w_{2,s}$) and space components whose widths are in an acceptable range ($w_{1,s} \leq w \leq w_{2,s}$). In a second version, the space width indicia distinguish between space components that are outside an acceptable range (w<$w_{1,s}$ or w>$w_{2,s}$) and space widths that are within an acceptable range $w_{1,s} \leq w \leq w_{2,s}$). In another version, the space width indicia represent the measured or estimated space widths themselves.

Each mark in the time delayed signal s(t−$\Delta t_d$) that has a measured or estimated mark length outside an acceptable mark width range has a selected mark indicium associated with it. Each space in the time delayed signal s(t−$\Delta t_d$) that has a measured or estimated space length outside an acceptable space width range has a selected space indicium associated with it. The time delayed signal s(t−$\Delta t_d$) and the two sequences MWI and SWI are associated with each other as a collective signal S(t;MI;SI) in any subsequent processing of the time delayed signal s(t−$\Delta t_d$) so that out-of bound mark widths and/or out-of-bound space widths are tagged.

Optionally, the MWMM 15 and the SWMM 17 can be combined into a mark/space width measuring module, MSWMM, if desired. After the mark widths and space widths are measured, each of the MWMM 15 and SWMM 17 behaves as a FIFO in which the oldest mark or space is removed at a first end and is replaced by a newly arriving mark or space at a second end.

The width of the initial current mark, w(MK;0), is measured or estimated by the MWMM 15, using any suitable measuring or estimating procedure, including one that is discussed in the following. The initial pre-mark FM(0) and the initial pre-space FS(0) together serve as a preamble to aid in alignment of the initial current mark MK(0) and to enhance the accuracy of the measurement or estimation of the current mark width. Any other reasonable approach can be used for mark and space alignment. The width of the initial current mark MK(0) is measured or estimated and compared against the acceptable range of mark widths. The SWMM 17 measures or estimates the width of the initial post-space PS(0) and compares this width with the acceptable range of space widths. The first mark FM(0) and first space FS(0) in the initial sequence are then passed on as part of, or preferably removed from, the digital stream that passes through the MWMM 15 and the SWMM 17.

At this point, the digital signal sequence s(t) has moved through the MWMM 15 and SWMM 17 to a point where: (1) the initial current mark MK(0) occupies the former location of the initial pre-mark FM(0); (2) the initial post-space PS(0) occupies the former location of the initial pre-space FS(0); (3) the initial post-mark PM(0) occupies the former location of the initial current mark MK(0); (4) the next post-space PS(1) occupies the former location of the initial post-space PS(0); and (5) the next post-mark PM(1) occupies the former location of the initial post-mark PM(0). In effect, the component groups FM(i), FS(i), MK(i), PS(i), PM(i) move forward by two each time. This is illustrated in the following sequence diagram, where i=0, 1, 2, . . . , I(last):

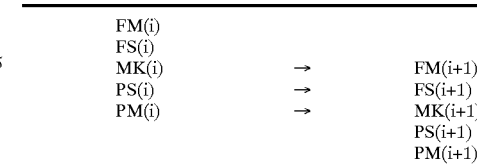

This diagram displays how each sub-sequence of five component groups FM(i), FS(i), MK(i), PS(i), PM(i) is replaced by another sub-sequence of five component groups FM(i+1), FS(i+1), MK(i+1), PS(i+1), PM(i+1) as the digital signal sequence moves through the TDM 11. The relationship of the width w(MK;i) (i=0, 1, . . . , I(last)) of each consecutive mark to the acceptable range of mark widths is noted. The relationship of the width w(PS;i) (i=0, 1, . . . , I(last)−1 or I(last)) of each consecutive space to the acceptable range of space widths is noted. The last post-mark PM(i=I(last)) and/or the last post-space PS(i=I(last)−1 or I(last)) in a sub-sequence of consecutive components (mark or space) in the digital signal stream will be followed by an end-of-stream indicium (preferably part of the stream), and this last sub-sequence can be processed by the MWMM 13 and/or SWMM 15 in the same manner as the preceding sub-sequences are processed.

When the digital signal stream s(t−$\Delta t_d$) emerges, component-by-component, from the TDM 11 after a selected time delay of $\Delta t_d$, a computer connected to the MWMM 15 and/or to the SWMM 17 is now aware of which mark widths w(MK;i) and which space widths w(PS;i) lie outside the accepted ranges. Appropriate action can be taken, if desired, to provide compensation for the mark widths and/or the space widths that lie outside the respective acceptable ranges set forth in the constraint (1). The selected time delay $\Delta t_d$ may be any time value in a range (10·T–100·T), such as 45T, sufficient to allow the MWMM 15 and SWMM 17 to perform the mark width and/or space width measurement or estimation procedure on a current mark group MK(i) of maximal length and/or on a post-space group PS(i) of maximal length.

Figure 4:
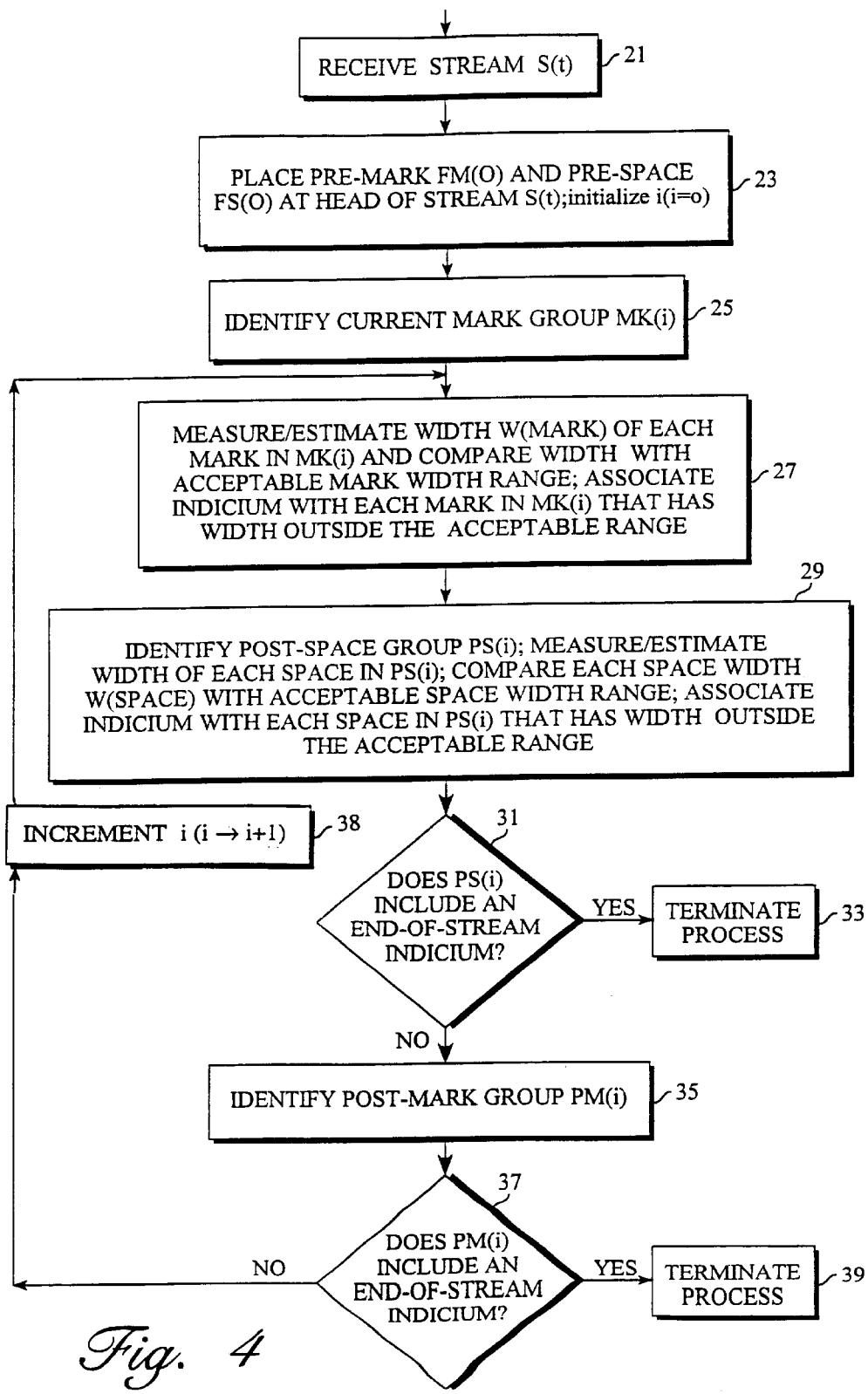
FIG. 4 is a flow chart illustrating a procedure for practicing the invention.

FIG. 4 is a flow chart illustrating a procedure for practicing the invention. In step 21, a digital signal stream s(t) is received at a MSD. In step 23, a fictitious pre-mark FM(0) and a fictitious pre-space FS(0) are positioned at the beginning of the stream s(t). In step 25, a (real) current mark FM(i) (initially with i=0) is identified. In step 27, the width of each mark in the component group MK(i) is measured or estimated, each mark width w(mark) is compared with a corresponding acceptable range of mark widths, and an indicium is associated with each mark width that lies outside the accepted range of mark widths (or, alternatively, lies within the accepted range of mark widths).

In step 29, the system identifies the next post-space group PS(i), measures or estimates the width w(space) of each space in PS(i), compares each space width with the acceptable space width range, and associates an indicium with each space in PS(i) that lies outside the acceptable range of space widths (or, alternatively, lies within the accepted range of space widths). In step 31, the system determines if the post-space group PS(i) includes an end-of-stream indicium.

If the answer to the question in step 31 is "yes", the procedure terminates, in step 33. If the answer to the question in step 31 is "no", the system moves to step 35 and identifies the next post-mark group PM(i) (initially, with i=0). In step 37, the system determines if the post-mark group PM(i) includes an end-of-stream indicium.

If the answer to the question in step 37 is "yes", the procedure terminates, in step 39. If the answer to the question in step 37 is "no", the system increments i (i→i+1) in step 38, and returns to step 27 at least once, with PM(i) now becoming MK(i+1).

Optionally, the pre-mark and pre-space can be removed or can be left in place for alignment or synchronization.

The width of a consecutive run of marks, or of a consecutive run of spaces, proceeds as follows in one embodiment. A clock, having a value C(t) at any time t, switches from a first state ("A" or "0") to a second state ("B" or "1") and back to state A with a selected uniform period T(CLK). Presence of a mark in the digital signal stream is represented by a value efm(t)=1, and presence of a space is represented by a value efin(t)=0, and a particular value efin(tn) is determined for each time $t=t_n$ corresponding to a transition of the clock from state A to state B (or from state B to state A). This produces a digital signal stream of values {efm($t_n$)} in a well known manner.

The digital signal stream {efm($t_n$)} (n=1, 2, 3, . . . ) appears as a sequence of symbols (each of value 0 or 1) of varying width. Consider two consecutive symbols, efm($t_{n-1}$) and efm($t_n$). Initially, efin($t_{n-1}$)=0 and efm($t_n$)=0 is a possibility, and the system continues until a "1" is first encountered. If efin($t_{n-1}$)=0 but efm($t_n$)=1, a count is begun of the marks. This count continues as long as efm($t_{n-1}$)= efm($t_n$)=1. When two consecutive symbols are first encountered for which efm($t_{n-1}$)=1 and efm($t_n$)=0, the mark count is terminated. If, at this point, the number of consecutive marks counted is greater than 11·T, the mark count is (re)set to 11·T. If the number of consecutive marks is less than 3·T, the mark count is (re)set to 3·T. If the number of consecutive marks is between 3·T and 11·T, the actual number of marks is used. These constraints can be covered by one of the following two relations:

Mark count used=min{$T$(max), max{$T$(min), actual mark count}} and

Mark count used=max{$T$(min), max{$T$(max), actual mark count}} where T(min)=3·T and T(max)=11·T; or some other pair of desired time interval values, T(min) and T(max), can be used. The system takes the actions set forth in Table 1 for mark counting, based on the symbol values of two consecutive symbols.

TABLE 1

| Mark Count Actions | | |
| --- | --- | --- |
| efm($t_{n-1}$) | efm($t_n$) | Action(s) Taken |
| 0 | 0 | Initial condition (only); continue |
| 0 | 1 | Begin mark count |
| 1 | 1 | Continue mark count |
| 1 | 0 | Terminate mark count |

The (consecutive) space count proceeds according to a similar procedure, as set forth in Table 2.

TABLE 2

| Space Count Actions | | |
| --- | --- | --- |
| efm($t_{n-1}$) | efm($t_n$) | Action(s) Taken |
| 0 | 0 | Initial condition (only); continue until first "1" is encountered |
| 1 | 0 | Begin space count |

TABLE 2-continued

| Space Count Actions | | |
| --- | --- | --- |
| efm($t_{n-1}$) | efm($t_n$) | Action(s) Taken |
| 0 | 0 | Continue space count |
| 0 | 1 | Terminate space count |

The space count used is defined, by analogy with the mark count used, according to one of the following two relations:

Space count used=min{$T$(max), max{$T$(min), actual space count}} and

Space count used=max{$T$(min), max{$T$(max), actual space count}}.

The invention provides a system and method for examining an incoming stream of digital signal marks and spaces and for promptly detecting a mark width or space width that lies outside an acceptable width range. This approach requires a relatively small, uniform time delay for this purpose, and the acceptable range of widths can be specified by any reasonable numbers. This approach does not require a time-consuming identification of each incoming signal component as a mark or space.

What is claimed is:

1. A method for indicating when a mark width or a space width in a digital signal stream is not within an acceptable mark width range or not within an acceptable space width range, the method comprising:

receiving a digital signal sequence having at least first and second signal components, including at least one mark and at least one space;

providing a replica of the digital sequence, delayed in time by a selected time delay amount;

measuring at least one mark width and, when a mark width is not within an acceptable mark width range, associating a mark indicium with the time delayed digital sequence indicating a relationship between the at least one mark width and the acceptable mark width range; and measuring at least one space width and, when a space width is not within an acceptable space width range, associating a space indicium with the time delayed digital sequence indicating a relationship between the at least one space width and the acceptable space width range.

2. The method of claim 1, further comprising choosing said acceptable mark width range to be 3·T≦w(mark)≦11·T, where T is a selected time interval length.

3. The method of claim 1, further comprising choosing said acceptable space width range to be 3·T≦w (space)$_c$≦11·T, where T is a selected time interval length.

4. The method of claim 1, further comprising choosing said selected time delay to lie in a selected time delay range of about 1 nsec≦$\Delta t_d$≦1000 nsec.

5. The method of claim 1, wherein said process of associating said mark indicium with said digital sequence comprises choosing said mark indicium to have: a first selected value if said mark width is less than an acceptable mark width minimum, a second selected value if said mark width is greater than an acceptable mark width maximum, and a third selected value if said mark width lies between the acceptable mark width minimum and the acceptable mark width maximum, where the first, second and third selected values are distinct.

6. The method of claim 1, wherein said process of associating said mark indicium with said digital sequence comprises choosing said mark indicium to have: a first selected value if said mark width is less than an acceptable mark width minimum or is greater than an acceptable mark width maximum, and a second selected value if said mark width lies between the acceptable mark width minimum and acceptable mark width maximum, where the first and second selected values are distinct.

7. The method of claim 1, wherein said process of associating said space indicium with said digital sequence comprises choosing said space indicium to have: a first selected value if said space width is less than an acceptable space width minimum, a second selected value if said space width is greater than an acceptable space width maximum, and a third selected value if said mark space lies between the acceptable space width minimum and the acceptable space width maximum, where the first, second and third selected values are distinct.

8. The method of claim 1, wherein said process of associating said space indicium with said digital sequence comprises choosing said space indicium to have: a first selected value if said space width is less than an acceptable space width minimum or is greater than an acceptable space width maximum, and a second selected value if said space width lies between the acceptable space width minimum and acceptable space width maximum, where the first and second selected values are distinct.

9. A system for indicating when a mark width or a space width in a digital signal stream is not within an acceptable mark width range or not within an acceptable space width range, the system comprising a computer that is programmed:

to receive a digital signal sequence having at least first and second signal components, including at least one mark and at least one space;

to provide a replica of the digital sequence, delayed in time by a selected time delay amount;

to measure at least one mark width and, when a mark width is not within an acceptable mark width range, associating a mark indicium with the time delayed digital sequence indicating a relationship between the at least one mark width and the acceptable mark width range; and to measure at least one space width and, when a space width is not within an acceptable space width range, associating a space indicium with the time delayed digital sequence indicating a relationship between the at least one space width and the acceptable space width range.

10. The system of claim 9, wherein said acceptable mark width range is chosen to be $3 \cdot T \leq w(mark) \leq 11 \cdot T$, where T is a selected time interval length.

11. The system of claim 9, wherein said selected space width range is chosen to be $3 \cdot T \leq w(space) \leq 11 \cdot T$, where T is a selected time interval length.

12. The system of claim 9, wherein said selected time delay is chosen to lie in a selected time delay range of about $1 \text{ nsec} \leq \Delta t_d \leq 1000 \text{ nsec}$.

13. The system of claim 9, wherein said process of associating said mark indicium with said digital sequence comprises choosing said mark indicium to have: a first selected value if said mark width is less than an acceptable mark width minimum, a second selected value if said mark width is greater than an acceptable mark width maximum, and a third selected value if said mark width lies between the acceptable mark width minimum and the acceptable mark width maximum, where the first, second and third selected values are distinct.

14. The system of claim 9, wherein said process of associating said mark indicium with said digital sequence comprises choosing said mark indicium to have: a first selected value if said mark width is less than an acceptable mark width minimum or is greater than an acceptable mark width maximum, and a second selected value if said mark width lies between the acceptable mark width minimum and acceptable mark width maximum, where the first and second selected values are distinct.

15. The system of claim 9, wherein said process of associating said space indicium with said digital sequence comprises choosing said space indicium to have: a first selected value if said space width is less than an acceptable space width minimum, a second selected value if said space width is greater than an acceptable space width maximum, and a third selected value if said space width lies between the acceptable space width minimum and the acceptable space width maximum, where the first, second and third selected values are distinct.

16. The system of claim 9, wherein said process of associating said space indicium with said digital sequence comprises choosing said space indicium to have: a first selected value if said space width is less than an acceptable space width minimum or is greater than an acceptable space width maximum, and a second selected value if said space width lies between the acceptable space width minimum and acceptable space width maximum, where the first and second selected values are distinct.

17. A method for indicating when a mark width or a space width in a digital signal stream is not within an acceptable mark width range or not within an acceptable space width range, the method comprising:

(1) receiving a digital signal sequence having at least first and second signal components, including at least one mark and at least one space;

(2) aligning a selected first mark;

(3) determining a width of the mark and comparing the mark width with an acceptable mark width range;

(4) when a mark width is not within the acceptable mark width range, associating a mark indicium with the digital sequence indicating a relationship between the mark width and the acceptable mark width range;

(5) determining if the mark includes the last signal component;

(6) when the mark includes the last signal component in the digital sequence, issuing the digital sequence and associated indicia as a modified digital sequence after a selected time delay $\Delta t_d$;

(7) when the mark does not include the last signal component in the digital sequence, determining a width of a space and comparing the space width with an acceptable space width range;

(8) when the space width is not within the acceptable space width range, associating a space indicium with the digital sequence indicating a relationship between the space width and the acceptable space width range;

(9) determining if the space includes the last signal component;

(10) when the space includes the last signal component in the digital sequence, issuing the digital sequence and associated indicia as a modified digital sequence after a selected time delay $\Delta t_d$; and

(11) when the space does not include the last signal component in the digital sequence, repeating at least once the processes (3), (4), (5), (6), (7), (8), (9) and (10).

18. The method of claim 17, wherein said process of aligning said selected mark comprises positioning a pre-mark, having a mark width w(mark;0) lying in an acceptable range of mark widths, and a pre-space, having a space width w(space;0) lying in an acceptable range of space widths, immediately preceding said first signal component in said digital sequence.

19. The method of claim 17, further comprising choosing said acceptable mark width range to be $3 \cdot T \leq w(mark) \leq 11 \cdot T$, where T is a selected time interval length.

20. The method of claim 17, further comprising choosing said acceptable space width range to be $3 \cdot T \leq w(space) \leq 11 \cdot T$, where T is a selected time interval length.

21. The method of claim 17, further comprising choosing said selected time delay to lie in a selected time delay range of about 1 nsec $\leq \Delta t_d \leq$ 1000 nsec.

22. The method of claim 17, wherein said process of associating said mark indicium with said digital sequence comprises choosing said mark indicium to have: a first selected value if said mark width is less than an acceptable mark width minimum, a second selected value if said mark width is greater than an acceptable mark width maximum, and a third selected value if said mark width lies between the acceptable mark width minimum and the acceptable mark width maximum, where the first, second and third selected values are distinct.

23. The method of claim 17, wherein said process of associating said mark indicium with said digital sequence comprises choosing said mark indicium to have: a first selected value if said mark width is less than an acceptable mark width minimum or is greater than an acceptable mark width maximum, and a second selected value if said mark width lies between the acceptable mark width minimum and acceptable mark width maximum, where the first and second selected values are distinct.

24. The method of claim 17, wherein said process of associating said space indicium with said digital sequence comprises choosing said space indicium to have: a first selected value if said space width is less than an acceptable space width minimum, a second selected value if said space width is greater than an acceptable space width maximum, and a third selected value if said mark space lies between the acceptable space width minimum and the acceptable space width maximum, where the first, second and third selected values are distinct.

25. The method of claim 17, wherein said process of associating said space indicium with said digital sequence comprises choosing said space indicium to have: a first selected value if said space width is less than an acceptable space width minimum or is greater than an acceptable space width maximum, and a second selected value if said space width lies between the acceptable space width minimum and acceptable space width maximum, where the first and second selected values are distinct.

26. A system for compensating for varying mark and space widths in a digital signal stream, the system comprising a computer that is programmed:

(1) to receive a digital signal sequence having at least first and second signal components, including at least one mark and at least one space;

(2) to align a selected first mark;

(3) to determine a width of the mark and to compare the mark width with an acceptable mark width range;

(4) when a mark width is not within the acceptable mark width range, to associate a mark indicium with the digital sequence indicating a relationship between the mark width and the acceptable mark width range;

(5) to determine if the mark includes the last signal component;

(6) when the mark includes the last signal component in the digital sequence, to issue the digital sequence and associated indicia as a modified digital sequence after a selected time delay $\Delta t_d$;

(7) when the mark does not include the last signal component in the digital sequence, to determine a width of a space and to compare the space width with an acceptable space width range;

(8) when a space width is not within the acceptable space width range, to associate a space indicium with the digital sequence indicating a relationship between the space width and the acceptable space width range;

(9) to determine if the space includes the last signal component;

(10) when the space includes the last signal component in the digital sequence, to issue the digital sequence and associated indicia as a modified digital sequence after a selected time delay $\Delta t_d$; and

(11) when the space does not include the last signal component in the digital sequence, to repeat at least once the processes (3), (4), (5), (6), (7), (8), (9) and (10).

27. The system of claim 26, wherein said computer is programmed to align said selected mark by positioning a pre-mark, having a mark width w(mark;0) lying in an acceptable range of mark widths, and a pre-space, having a space width w(space;0) lying in an acceptable range of space widths, immediately preceding said first signal component in said. digital sequence.

28. The system of claim 26, wherein said acceptable mark width range is chosen to be $3 \cdot T \leq w(mark) \leq 11 \cdot T$, where T is a selected time interval length.

29. The system of claim 26, wherein said selected mark width range is chosen to be $3 \cdot T \leq w(space) \leq 11 \cdot T$. where T is a selected time interval length.

30. The system of claim 26, wherein said selected time delay is chosen to lie in a selected time delay range of about 1 nsec $\leq \Delta t_d \leq$ 1000 nsec.

31. The system of claim 26, wherein said process of associating said mark indicium with said digital sequence comprises choosing said mark indicium to have: a first selected value if said mark width is less than an acceptable mark width minimum, a second selected value if said mark width is greater than an acceptable mark width maximum, and a third selected value if said mark width lies between the acceptable mark width minimum and the acceptable mark width maximum, where the first, second and third selected values are distinct.

32. The system of claim 26, wherein said process of associating said mark indicium with said digital sequence comprises choosing said mark indicium to have: a first selected value if said mark width is less than an acceptable mark width minimum or is greater than an acceptable mark width maximum, and a second selected value if said mark width lies between the acceptable mark width minimum and acceptable mark width maximum, where the first and second selected values are distinct.

33. The system of claim 26, wherein said process of associating said space indicium with said digital sequence comprises choosing said space indicium to have: a first selected value if said space width is less than an acceptable space width minimum, a second selected value if said space width is greater than an acceptable space width maximum, and a third selected value if said space width lies between the acceptable space width minimum and the acceptable space width maximum, where the first, second and third selected values are distinct.

34. The system of claim 26, wherein said process of associating said space indicium with said digital sequence comprises choosing said space indicium to have: a first selected value if said space width is less than an acceptable space width minimum or is greater than an acceptable space width maximum, and a second selected value if said space width lies between the acceptable space width minimum and acceptable space width maximum, where the first and second selected values are distinct.

35. A method for measuring a width of a mark, the method comprising:

receiving a digital signal sequence having at least first and second signal components, including at least one mark and at least one space;

aligning a first mark that follows a first space in the sequence;

counting the number n(mark) of consecutive marks, including the first mark, until a first space occurs following the first mark; and computing a mark count to be used for the consecutive marks according to at least one of the relations (1) mark count=min{T(max), max{n(mark), T(min)}} and (2) mark count=max{T(min), min{n(mark), T(max)}}, where T(min) and T(max) are selected time interval values with T(min)<T(max).

36. The method according to claim 35, further comprising choosing at least one of said selected values T(min) and T(max) to be T(min)=3·T and T(max)=11·T, where T is a selected time interval length.

37. A method for measuring a width of a space, the method comprising:

receiving a digital signal sequence having at least first and second signal components, including at least one mark and at least one space;

aligning a first space that follows a first mark in the sequence;

counting the number n(space) of consecutive spaces, including the first space, until a first mark occurs following the first space; and computing a space count to be used for the consecutive space according to at least one of the relations (1) space count=min{T(max), max{n(space), T(min)}} and (2) space count=max{T(min), min{n(space), T(max)}}, where T(min) and T(max) are selected time interval values with T(min)<T(max).

38. The method according to claim 37, further comprising choosing at least one of said selected values T(min) and T(max) to be T(min)=3·T and Y(max)=11·T, where T is a selected time interval length.

* * * * *